(12) United States Patent
Yoshida et al.

(10) Patent No.: US 6,710,150 B2
(45) Date of Patent: Mar. 23, 2004

(54) PROTOLYTICALLY LEAVING GROUP-CONTAINING COPOLYMER AND PROCESS FOR ITS PRODUCTION

(75) Inventors: Masatoshi Yoshida, Nara (JP); Shigeru Tanimori, Hirakata (JP); Yasutaka Nakatani, Takatsuki (JP); Yohei Murakami, Suita (JP); Hideaki Nagano, Himeji (JP)

(73) Assignee: Nippon Shokubai Co., Ltd., Osaka (JP)

( * ) Notice: Subject to any disclaimer, the term of this patent is extended or adjusted under 35 U.S.C. 154(b) by 0 days.

(21) Appl. No.: 09/995,817

(22) Filed: Nov. 29, 2001

(65) Prior Publication Data

US 2002/0099147 A1 Jul. 25, 2002

(30) Foreign Application Priority Data

Nov. 30, 2000 (JP) ......................... 2000-364466

(51) Int. Cl.$^7$ ............................. C08F 118/02
(52) U.S. Cl. ................. 526/319; 522/150; 526/334; 526/348; 526/266; 526/297; 526/326; 526/329.2
(58) Field of Search ............... 522/150; 526/334, 526/348.2, 266, 297, 326, 319, 329.2

(56) References Cited

U.S. PATENT DOCUMENTS

| | | | | |
|---|---|---|---|---|
| 5,759,739 | A | * 6/1998 | Takemura et al. | 430/270.1 |
| 6,432,608 | B1 | * 8/2002 | Fujie et al. | 430/270.1 |
| 6,440,634 | B1 | * 8/2002 | Ohsawa et al. | 430/270.1 |
| 2002/0090569 | A1 | * 7/2002 | Suzuki et al. | 430/270.1 |

FOREIGN PATENT DOCUMENTS

JP          2000-131847 A       5/2000

* cited by examiner

*Primary Examiner*—Tatyana Zalukaeva
(74) *Attorney, Agent, or Firm*—Sughrue Mion, PLLC

(57) ABSTRACT

The present invention provides a protolytically leaving group-containing copolymer having improved characteristics such as increased solubility in alkaline aqueous solution in the presence of a proton, thus finding application with advantage in various uses, and a process for producing the copolymer.

A protolytically leaving group-containing copolymer represented by the following general formula (1):

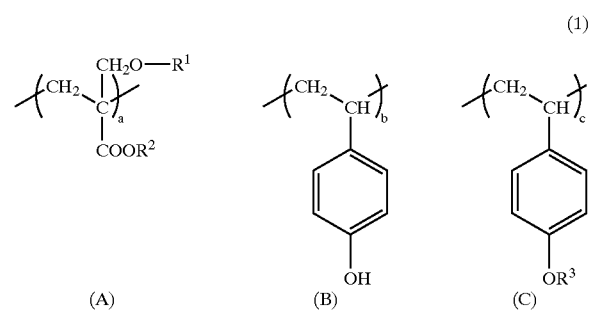

(1)

in the formula, $R^1$, $R^2$ and $R^3$ are the same or different and each represents a protolytically leaving group and a, b and c represent the amounts of existence (mole %) of repeating units (A), (B) and (C), respectively, in the copolymer, which comprises the repeating unit (A) as well as the repeating unit (B) and/or the repeating unit (C) and has a weight average molecular weight of 2000~30000, said a, b and c satisfying the condition that a is 5 to 30 mole % and (b+c) is 70 to 95 mole %.

5 Claims, 1 Drawing Sheet

PROTOLYTICALLY LEAVING GROUP-CONTAINING COPOLYMER AND PROCESS FOR ITS PRODUCTION

TECHNICAL FIELD

The present invention relates to a protolytically leaving group-containing copolymer and a process for its production.

BACKGROUND OF THE INVENTION

A protolytically leaving group-containing copolymer has a group which is eliminated by proton and replaced with hydrogen atom and, upon the replacement of such groups with hydrogen atoms, the copolymer undergoes changes in the characteristics such as solubility in alkaline aqueous solution and so forth. When such a copolymer is caused to coexist with an acid catalyst acting as a proton donor and the system is exposed to light, plasma or radiation or heated to generate a proton from the acid catalyst, the characteristics such as the solubility in alkaline aqueous solution is significantly changed before and after irradiation. By taking advantage of this property, the copolymer can be applied for various purposes in chemical industry, for example photolithographic materials and low profile additives.

Japanese Kokai Publication Hei-11-171836 discloses a polymer having a repeating unit composed of a certain allyl ether derivative. This polymer has one protolytically leaving group as a defined functional group in the repeating unit, by virtue of which it can be utilized as a photolithographic material or a low profile additive. However, the polymer has room for structural sophistication to further improve the characteristics such as solubility in alkaline aqueous solution in the presence of a proton.

Japanese Kokai Publication Hei-9-244246 discloses a radiation-sensitive resin composition comprising two kinds of copolymers each having two kinds of repeating units of defined structures in combination, and Japanese Kokai Publication Hei-10-186665 discloses a photoresist composition comprising a copolymer having three kinds of repeating units of defined structures. Each of these copolymers comprises a repeating unit having one protolytically leaving group, by virtue of which it can be used as a resist material. However, even these copolymers have room for structural sophistication for magnifying the difference in the degree of change or for shortening the time necessary for the change to take place in characteristics, such as the solubility in alkaline aqueous solution, in the presence versus absence of a proton to thereby make them better suited for various applications.

In view of the above state of the art, the present invention has for its object to provide a protolytically leaving group-containing copolymer improved in characteristics such as solubility in alkaline aqueous solution in the presence of a proton, thus being applied for various purposes with advantage, and a production method of the copolymer.

SUMMARY OF THE INVENTION

The present invention relates to a protolytically leaving group-containing copolymer represented by the following general formula (1):

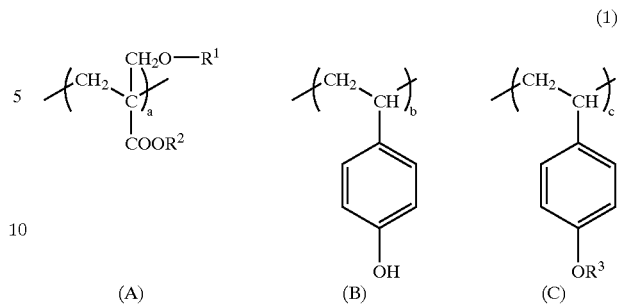

(A)     (B)     (C)

in the formula, $R^1$, $R^2$ and $R^3$ are the same or different and each represents a protolytically leaving group and a, b and c represent the amounts of existence (mole %) of repeating units (A), (B) and (C), respectively, in the copolymer, which comprises the repeating unit (A) as well as the repeating unit (B) and/or the repeating unit (C) and has a weight average molecular weight of 2000~30000, said a, b and c satisfying the condition that a is 5 to 30 mole % and (b+c) is 70 to 95 mole %.

The inventors of the present invention explored into various protolytically leaving group-containing copolymers and, with attention first directed to the fact that the necessary copolymer structure is one comprising a repeating unit of the defined structure which comprises two protolytically leaving groups and a repeating unit of the defined structure which is adapted to provide hydrophilicity to the copolymer and/or a repeating unit of the defined structure which comprises one protolytically leaving group, found that by restricting the amounts of existence of said repeating units in the copolymer to defined ranges and, by restricting the weight average molecular weight of the copolymer to a defined range, the solubility of the copolymer in alkaline aqueous solution in the presence of a proton can be quickly increased to thereby provide a neat solution to the above problem. The present invention has been developed on the basis of the above finding.

DETAILED DESCRIPTION OF THE INVENTION

Figure 1:
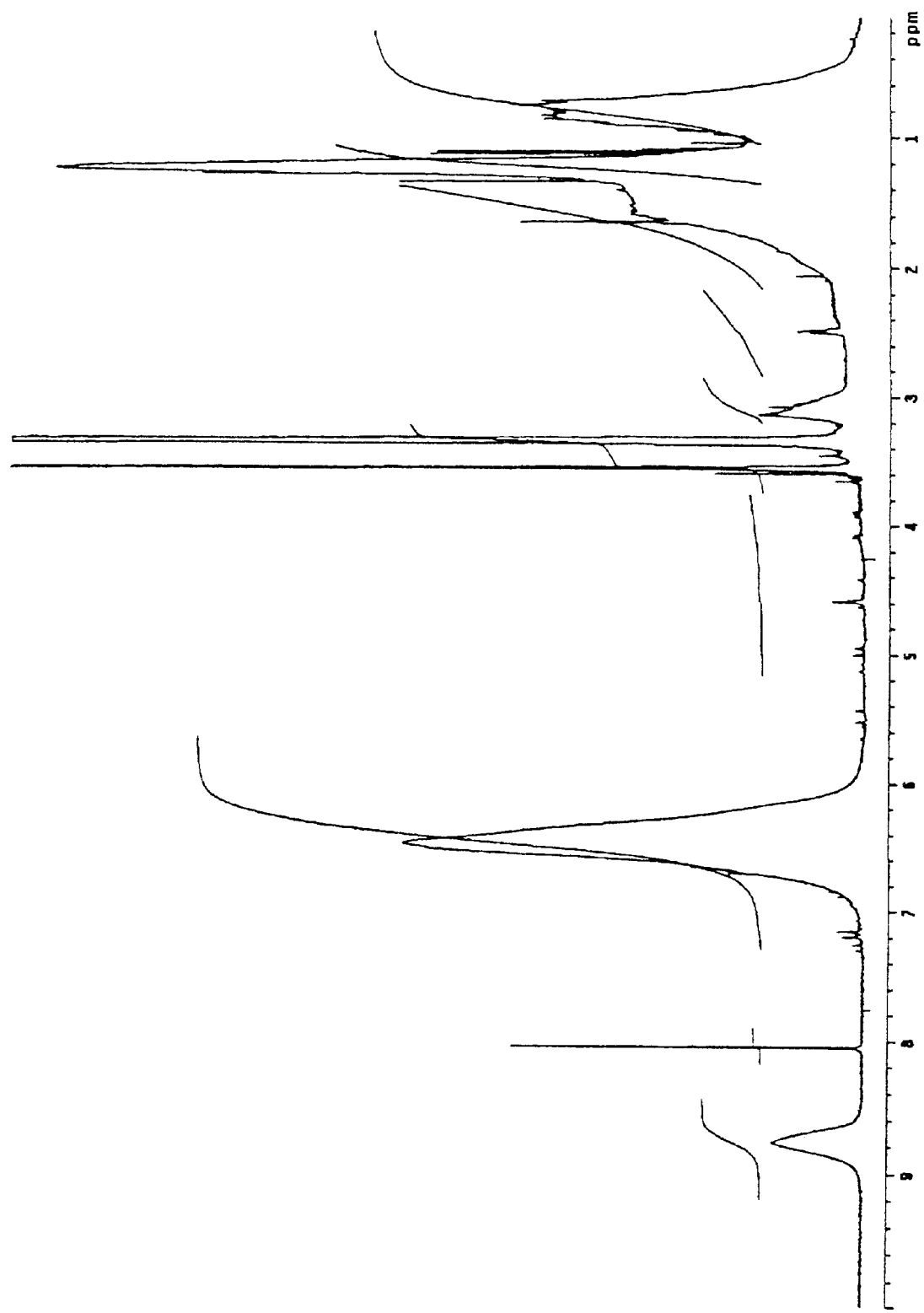
FIG. 1 is a $^1$H-NMR chart of the copolymer (A) obtained in Example 1.

The present invention is now described in detail.

The protolytically leaving group-containing copolymer of the invention is represented by the above general formula (1), comprises a repeating unit (A) and a repeating unit (B) and/or a repeating unit (C) and has a weight average molecular weight of 2000 to 30000. Such copolymer may occur in the form comprising two kinds of repeating units, namely the repeating unit (A) and the repeating unit (B), the form comprising two kinds of repeating units, namely the repeating unit (A) and the repeating unit (C), and the form comprising three kinds of repeating units, namely the repeating unit (A), the repeating unit (B) and the repeating unit (C). Each of these repeating units may be the same or different. More specifically, among forms mentioned above, the form comprising two kinds of repeating units (A) and (B) and the form comprising three kinds of repeating units (A), (B) and (C) are preferred in terms of the solubility in alkaline aqueous solution in the presence of a proton. The mode of addition of these repeating units is not particularly restricted but includes, for example, a random addition, a block addition or an alternate addition.

Referring to the above general formula (1), the protolytically leaving group means a group which is replaced by a hydrogen atom, in the presence of a proton. The conditions for this replacement are not particularly restricted. The copolymer can be supplied with a proton by causing the copolymer to coexist with an acid catalyst acting as a proton donor and being either exposed to light, plasma or radiation or heated to thereby generate the proton from the acid catalyst. Such acid catalyst includes, for example, onium salts, sulfone compounds, sulfonic acid ester compounds, sulfonimide compounds, diazomethane compounds, organic sulfonic acids such as p-toluenesulfonic acid, benzenesulfonic acid, trifluoromethanesulfonic acid, etc.; hydrochloric acid, sulfuric acid, and nitric acid, etc. These may be used each independently or in a combination of two or more species.

The above protolytically leaving group includes, for example, branched alkyl groups such as t-butyl, isopropyl and like groups; cyclic residues of alicyclic compounds of the general formula $C_n H_{2n}$ (n is an integer of not less than 3) such as cyclobutyl, cyclopentyl, cyclohexyl, cycloheptyl and like groups; groups derived from spiro compounds such as spiroheptane and spirooctane which are available on introducing a crosslinking carbon between cyclic residues; hetero atom-containing functional groups such as tetrahydropyranyl, tetrahydrofuranyl, 3-oxocyclohexyl, methoxymethyl, ethoxymethyl, 1-methoxyethyl, 1-ethoxyethyl, 1-butoxyethyl, t-butoxycarbonyl and like groups; isobornyl groups, adamantyl groups, methyladamantyl groups, terpene ring-containing substituents derived from such rings or compounds as norbornyl ring, bornene ring, menthyl ring, menthane ring, camphor ring, isocamphor ring, sesquiterpene ring, santonering, diterpenering, triterpenering, thujane, sabinene, thujone, carane, carene, pinane, norpinane, bornane, camphene, tricyclene, etc.; and groups derived from steroids and polycyclic compounds such as cholesteric ring, bile acid, digitaloids, steroid saponins and so forth. These may each be substituted by hydroxyl, carboxyl, $C_{1-4}$ alkyl, hydroxyalkyl, carboxylalkyl and like groups. More particularly, said protolytically leaving group is an organic group containing 4 to 30 carbon atoms, namely, substituents containing a branched alkyl group, an alicyclic residue, or a terpene ring.

Among the protolytically leaving groups specifically mentioned above, t-butyl, cyclohexyl, isobornyl and adamantyl groups are preferred. Thus, referring to the general formula (1), $R^1$, $R^2$ and $R^3$ maybe the same or different and each is preferably t-butyl, cyclohexyl, isobornyl or adamantyl group. In such cases, the effect of the invention can be satisfactorily expressed. Furthermore, in the copolymer of the invention, the hydrogen atom of the hydrocarbon constituting the skeleton of the copolymer may be substituted by other groups within the range not adversely affect physical properties such as the protolytic propensity, the dissolution rate in alkaline aqueous medium, and the like. The same is true of the aromatic ring introduced into the copolymer, thus, the ring may be substituted by substituents other than hydrogen atom. Specifically, said other substituents include, for example, organic groups such as alkyl groups (ethyl, t-butyl, and like groups); alkoxyl groups; carboxyl groups; hydroxyl groups; amino group; sulfone groups; and halogen atoms. These other substituents may be in such structural forms as carboxylates, ammonium salts, quaternary ammonium salts, metal salts, and so forth.

The protolytically leaving group-containing copolymer according to the invention has a weight average molecular weight of 2000 to 30000. If it is less than 2000, the heat resistance of the copolymer will be poor. If it exceeds 30000, the difference of the change in solubility in alkaline aqueous medium in the presence versus in the absence of a proton is not sufficient, hence the effect of the invention will not be sufficiently manifested. Preferably, it is 2500 to 15000 and more preferably, it is 3000 to 9000. As used in this specification, the term "weight average molecular weight" means the weight average molecular weight in terms of polystyrene equivalent as determined by gel permeation chromatography.

In the protolytically leaving group-containing copolymer according to the invention, said a, b and c in the above general formula (1) satisfy the condition that a is 5 to 30 mole % as well as the sum of b and c, namely (b+c), is 70 to 95 mole %. If a is less than 5 mole % and (b+c) exceeds 95 mole %, the solubility in alkaline aqueous solution is high even in the absence of a proton. If a exceeds 30 mole % and (b+c) is less than 70 mole %, the copolymer will be low in hydrophilicity and it repels water. Thus, the effect of the invention is not fully manifested in either case. Thus, one of the structural features of the copolymer according to the invention resides in the thus-defined ranges for a and (b+c) and because of this feature, the copolymer is superior to the conventional copolymer in various characteristics such as the solubility in alkaline aqueous solution in the presence of a proton, hence can be applied for various purposes more advantageously. Preferably, a is 10 to 25 mole % and (b+c) is 75 to 90 mole % and more preferably, a is 10 to 20 mole % and (b+c) is 80 to 90 mole %. In the present invention, the amount of existence of all repeating units constituting the copolymer is taken as 100 mole %.

In the present invention, the above b is preferably 45 to 95 mole %. If it is less than 45 mole %, hydrophilicity of the copolymer tends to be low and it may repel water. If it exceeds 95 mole %, the solubility in alkaline aqueous solution tends to be high even in the absence of a proton. More preferably, it is 50 to 90 mole % and still more preferably, 60 to 85 mole %.

The present invention is further related to a production method of a protolytically leaving group-containing copolymer comprising the repeating unit (A) and the repeating unit (B) and being represented by the above general formula (1), and a production method of a protolytically leaving group-containing copolymer which comprises carrying out a step of producing a copolymer comprising said repeating unit (A) and said repeating unit (C), followed by carrying out a step of replacing the group represented by $R^3$ in said repeating unit (C) totally or partially with a hydrogen atom to form said repeating unit (B). By this production method, among the above-mentioned copolymers having protolytically leaving groups of the invention, the form of copolymer comprising two kinds of repeating units as said repeating unit (A) and repeating unit (B) and the form of copolymer comprising three kinds of repeating units as said repeating unit (A), repeating unit (B) and repeating unit (C), can be produced with good efficiency. The copolymer of the invention can also be obtained by carrying out a polymerization using a monomer component containing the monomer constituting the repeating unit (A) and the monomer constituting the repeating unit (B) and/or the monomer constituting the repeating unit (C) in a defined amount.

In the step of producing a copolymer comprising said repeating unit (A) and said repeating unit (C), the copolymerization is preferably carried out using a monomer component comprising the monomer constituting the repeating unit (A) and the monomer constituting the repeating unit (C).

The above monomer constituting the repeating unit (A) includes, for example, acrylic ester derivatives represented by the following general formula (2):

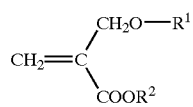
(2)

in the formula, $R^1$ and $R^2$ are as defined above. As the production method of such an acrylic ester derivative, the method can be preferably employed which comprises subjecting an acrylic ester represented by the following general formula (3):

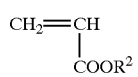
(3)

in the formula, $R^1$ is as defined above,
to methylolation to give an α-(hydroxymethyl)acrylic ester and reacting this α-(hydroxymethyl)acrylic ester with an olefin. In this case, the method for methylolation includes the known method which comprises reacting the corresponding acrylic ester with formaldehyde in the presence of a basic catalyst, for instance.

The method of reacting an olefin with the α-(hydroxymethyl)acrylic ester to be used in the production method of an acrylic ester derivative represented by the above general formula (2) is now described.

The olefin mentioned above is not particularly restricted but includes, for example, chain olefins containing 4 to 20 carbon atoms, such as ethylene, propylene, 1-butene, isobutylene, butadiene, etc.; cycloolefins such as cyclopentene, cyclohexene, cyclopentadiene, etc.; polycyclic olefins such as norbornylene, bicyclo[2,2,1]hepta-2-ene, bicyclo[2,2,1]hepta-2,5-diene, 5-norbornene-2-methanol, bicyclo[2,2,2]octa-2-ene, bicyclo[2,2,2]octa-2,5-diene, bicyclononadiene, dicyclopentadiene, methylcyclopentadiene dimer, bicyclopentadiene acetate, adamantane, 2-methyleneadamantane, etc.; olefin terpenes such as camphene, terpineol, terpinen-4-ol, α-terpinene, γ-terpinene, etc.; olefin alcohols such as allyl alcohol, crotyl alcohol, allylcarbinol, etc.; olefin aldehydes such as acrolein, methacrolein, crotonaldehyde, etc.; olefin-carboxylic acids such as acrylic acid, methacrylic acid, maleic acid, succinic acid, etc.; olefin-carboxylic esters such as acrylic esters, methacrylic esters, crotonic esters, α-hydroxymethylacrylic esters, etc.; olefin ketones such as methyl vinyl ketone, ethylideneacetone, mesityl oxide, etc.; vinyl ethers such as methyl vinyl ether, ethyl vinyl ether, butyl vinyl ether, etc.; styrene, α-methylstyrene, acrylonitrile, methacrylonitrile, and so forth. These may be used each independently or in a combination of two or more species. Moreover, these may be substituted by alkyl, hydroxyl or carboxyl group and halogen atom. The preferred form of such olefin is that it contains isobutylene, cyclohexene, camphene or adamantane. In such cases, these are preferably contained as the main component.

As the level of addition of the olefin relative to said α-(hydroxymethyl)acrylic ester, for example, the level of the olefin is preferably 0.01 to 100 moles per mole of the α-(hydroxymethyl)acrylic ester. If it is less than 0.01 mole, the amount of unreacted α-(hydroxymethyl)acrylic ester after the reaction tends to be increased. If it exceeds 100 moles, the amount of unreacted olefin after the reaction tends to be increased. In both cases, the reaction efficiency will be decreased.

In the above reaction, a polymerization inhibitor and/or molecular oxygen is preferably added to the reaction system, since the starting reactant α-(hydroxymethyl)acrylic ester and the product acrylic ester derivative have a vinyl group within the molecule and, hence, are readily polymerizable. More preferably, for sufficient inhibition of polymerization, a polymerization inhibitor and molecular oxygen are used in combination.

The above polymerization inhibitor is not particularly restricted but includes, for example, hydroquinone, hydroquinone monomethyl ether, p-benzoquinone, methylhydroquinone, t-butylhydroquinone, di-t-butylhydroquinone, t-butylcatechol, and phenothiazine, etc. These may be used each independently or in a combination of two or more species. As the level of addition of such a polymerization inhibitor, for example, 0.001 to 10 weight % is preferred, regarding the resulting acrylic ester derivative as 100 weight %. As the molecular oxygen mentioned above, air can be used, for instance. In this case, air may be bubbled through the reaction system (so-called bubbling).

In the above reaction, one or two or more kinds of the known catalysts and/or solvents which are used in the reaction of a hydroxyl group-containing compound with an olefin can be employed. The catalyst is not particularly restricted but includes, for example, organic sulfonic acids such as paratoluenesulfonic acid, benzenesulfonic acid, etc.; heteropolyacids such as phosphotungstic acid, phosphomolybdic acid, etc.; protonic acids such as strongly acidic ion exchange resins and partial metal salts thereof; and Lewis acids such as boron trifluoride-ethyl ether complex, etc. As the level of addition of such a catalyst, for example, not more than 50 weight % is preferred regarding the α-(hydroxymethyl)acrylic acid ester as 100 weight %. If it exceeds 50 weight %, no further improvement in reaction-promoting effect may be expected and it is not preferable from economical viewpoint. The more preferred level is not more than 30 weight %. The solvent is not particularly restricted inasmuch as it is a solvent which does not interfere with the reaction. Thus, for example, aromatic solvents such as benzene, toluene, xylene, etc.; and aliphatic solvents such as n-heptane, n-octane, cyclohexane, methylcyclohexane, etc. can be used with advantage.

Regarding the reaction conditions of the above reaction, the reaction conditions used in the various known processes, for example the process for producing an ether by reacting a hydroxyl group-containing compound with an olefin, can be utilized. For example, the reaction temperature is preferably 0 to 150° C. in order to inhibit the polymerization mentioned above. If the temperature is less than 0° C., the reaction time will be excessively long and it may be difficult to produce the acrylic ester derivative effectively. If the temperature exceeds 150° C., the above-mentioned polymerization may not be inhibited. The more preferred temperature is 30 to 120° C. The reaction pressure may be any of ordinary pressure (atmospheric), reduced pressure or increased pressure. The reaction time can properly be selected according to the reaction temperature and the kinds, combination and amounts of the α-(hydroxymethyl)acrylic ester and the olefin so that the reaction will be complete within the time.

After completion of the above reaction, the catalyst is preferably removed. The method which can be used for this purpose includes washing with water; cleaning with an alkaline aqueous solution; and the method which comprises adding an acid adsorbent to adsorb the catalyst in the reaction solution to form a insoluble matter and subjecting the reaction solution to filtration or the like. After completion of the reaction, the desired product can be recovered by distillation, extraction, separation by using column or the like, for instance.

The monomer to constitute the repeating unit (C) according to the invention includes, for example, the compounds represented by the following general formula (4);

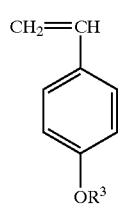

(4)

in the formula, $R^3$ is as defined above.

For example, as the production method of such compounds, in the above-described method for producing an acrylic ester derivative by reacting an α-(hydroxymethyl)acrylic ester with an olefin, 4-hydroxystyrene is used in lieu of the α-(hydroxymethyl)acrylic ester to be reacted with the olefin.

In the production method according to the invention, it is preferred to adjust the amount of use of the above essential monomer in monomer component within the range of the amount of existence (mole %) of the essential repeating units of the copolymer according to the invention. Moreover, inasmuch as the effect of the invention can be manifested, one or two or more monomers other than said essential monomers can be employed. Such monomers are not particularly restricted but include, for example, styrenic compounds such as styrene, α-methylstyrene, 4-hydroxystyrene, etc.; (meth)acrylonitrile; (meth)acrylic acid and its esters; α-hydroxymethylacrylic acid and its esters, 5-norbornene-2-carboxylic acid and its esters, 5-norbornene-2,3-dicarboxylic anhydride and its esters, 5-norbornene-2-methanol, maleic anhydride and its esters, and maleimide, etc.

The copolymerization method that can be used in carrying out the step of producing a copolymer comprising the repeating unit (A) and the repeating unit (C) includes, for example, various known methods such as the method using a polymerization initiator; the polymerization method involving exposure to a radiation such as an ionizing radiation, an electron beam or the like or ultraviolet rays; and the polymerization method by heating.

In the above copolymerization method, the polymerization initiator is not particularly restricted but includes peroxides and azo compounds such as 2,2'-azobisisobutyronitrile and dimethyl 2,2'-azobis(2-methylpropionate), for instance, and these can be used each independently or in a combination of two or more species. Preferably, a polymerization initiator not containing a cyano group is employed. As regards the reaction conditions for the copolymerization, the reaction is preferably conducted in an inert gas atmosphere such as nitrogen gas.

The production method of the invention includes a step of replacing the group represented by $R^3$ in repeating unit (C) totally or partially with a hydrogen atom to form the repeating unit (B). As for such step, for example, a method which comprises dissolving a copolymer comprising the repeating unit (A) and the repeating unit (C) in a solvent and, using an acid catalyst, selectively eliminating the group represented by $R^3$ in the repeating unit (C) totally or partially can be used with advantage. In these cases, it is preferred to select the reaction condition properly so that the amount of existence of the repeating unit (B) in the product copolymer will fall within the above-defined range. The acid catalyst used in this case includes, for example, the same ones as mentioned hereinbefore. For causing the above selective elimination to take place, the reaction is preferably carried out at 30 to 70° C. The more preferred temperature is 40 to 60° C. Still more preferably, trifluoromethanesulfonic acid is used as the acid catalyst.

As regards the means for confirming the existence of said essential structures in the copolymer of the invention or the copolymer produced by the production method of the invention, $^1$H-NMR and $^{13}$C-NMR spectrometric analyses, for instance, can be used with advantage.

The copolymer of the invention as well as the copolymer produced by the production method of the invention, when caused to coexist with an acid catalyst acting as a proton donor and irradiated with light, plasma, radiation or the like, or heated to generate a proton from the acid catalyst, undergoes remarkable changes in characteristics such as the solubility in alkaline aqueous solution as compared with the copolymer prior to irradiation. Since these changes in characteristics are more dramatic than those of the conventional copolymer, the solubility in alkaline aqueous solution is low before release of a proton, but the solubility is rapidly increased after release of the proton. Therefore, this copolymer is of value as a copolymer which can be used with advantage in a variety of purposes in chemical industry, such as photolithographic materials and low profile additives.

The protolytically leaving group-containing copolymer according to the invention, constituted as described above, has been improved in characteristics such as the solubility in alkaline aqueous solution in the presence of a proton and is of value as a copolymer which can be applied with advantage for various purposes.

BEST MODES FOR CARRYING OUT THE INVENTION

The following examples illustrate the present invention in further detail but these are by no means limitative of the scope of the invention. In the examples, "part(s)" means "part(s) by weight".

EXAMPLE 1

Polymerization Reaction

A2000 ml flask equipped with a stirrer, nitrogen gas inlet tube, thermometer and condenser was charged with 545 parts of ethyl acetate and the temperature was increased to 80° C. with nitrogen purging. The flask was charged with 15 weight % of a monomer mixture composed of 642 parts of p-t-butoxystyrene (PBS) and 119 parts of t-butyl (α-isobornyloxymethyl)acrylate (TIBA). Then, the flask was charged with 15 weight % of an initiator solution composed of 115 parts of dimethyl 2,2'-azobis (2-methylpropionate) (product of Wako Pure Chemical Ind.; trade name V-601) and 200 parts of ethyl acetate to initiate a polymerization. At 10 minutes after the start of polymerization, the dropwise addition of the monomer mixture and initiator solution was started. This dropwise addition of the monomer mixture was completed in 350 minutes and that of the initiator solution was completed in 380 minutes. The reaction mixture was then subjected to maturation for 90 minutes. The internal temperature was maintained at 80±1° C. during the polymerization. Using Tosoh Corporation's HLC-8120GPC, the molecular weight of the thus-obtained copolymer was determined. The weight average molecular weight was found to be 4980 and the molecular weight distribution (Mw/Mn) to be 1.56. From the assay of residual monomers, the monomer conversion of PBS was found to be 87.1% and that of TIBA was 85.1%. Accordingly, the structure of the resulting copolymer was calculated to be: the PBS unit 90.2 mole % and the TIBA unit 9.8 mole %.

Selective Elimination Reaction

The copolymer obtained by the polymerization reaction was purified by methanol precipitation. This copolymer, 100 parts, was dissolved in a mixed solvent of 200 parts of dioxane and 300 parts of acetone and the temperature was increased to 45° C. To this solution was added 0.0211 part of the acid catalyst trifluoromethanesulfonic acid to initiate a selective elimination reaction. At 15 minutes after addition of the acid catalyst, isobutene passed through the condenser was confirmed. The reaction was further continued and stopped by cooling at 240 minutes after addition of the acid catalyst. The reaction mixture was poured in 3000 parts of deionized water and purified by precipitation. The precipitate was filtered and dried to give a powdery copolymer (A). Based on the NMR determination of phenolic hydroxyl group and t-butyl group, the structure was confirmed to be: the TIBA unit 10 mole %, the p-hydroxystyrene (PHS) unit 70 mole % and the PBS unit 20 mole %. The NMR chart is shown in FIG. 1. As the result of the molecular weight determination by GPC, the weight average molecular weight was 3970 and molecular weight distribution (Mw/Mn) was 1.47. The acid value determination and the NMR chart revealed there was substantially no cleavage of t-butyl and isobornyl groups from TIBA under this reaction condition.

Confirmation of Physical Properties

To confirm the photolithographic property of the copolymer obtained, 20 g of the copolymer (A) was dissolved in 50 g of dioxane, added with 0.211 part of trifluoromethanesulfonic acid and reacted at 100° C. for 1 hour. Before and after this reaction, the copolymer (A) was spin-coated on a quartz plate with a dry membrane thickness of 1 μm and the coated plate was immersed in a 5% aqueous solution of tetramethylammonium hydroxide at 23° C. for 10 seconds. The dissolution membrane thickness was measured with Ulvac Japan, Ltd.'s DEKTAK II A Surface Roughness Test System to determine the alkaline aqueous medium dissolution rate (m/sec.). The results are shown in Table 1.

The copolymer (A) had a good affinity for water with a dissolution rate of $9 \times 10^{-9}$ m/sec. before the reaction, but the dissolution rate after the reaction was as high as not less than $10^{-7}$ m/sec. Thus, the alkaline aqueous medium dissolution rate was dramatically changed before and after the reaction with the acid catalyst, indicating that it was a favorable polymer for photolithography purpose.

Comparative Example 1

Except that 361 parts of PBS and 400 parts of TIBA were used, the procedure of Example 1 was repeated to obtain a comparative polymer (A'). Using the comparative polymer (A'), the physical property confirmation experiment was carried out as in Example 1. The results are shown in Table 1. In the physical property confirmation experiment, the comparative polymer (A') showed water-repellent properties before the reaction, giving a dissolution rate of 0 m/sec., and the dissolution rate after the reaction was not so high, i.e. $5 \times 10^{-8}$ m/sec. Therefore, it was not a favorable polymer for photolithographic purpose.

Comparative Example 2

Except that TIBA was not used but 761 parts of PBS was used, the procedure of Example 1 was repeated to give a comparative polymer (B'). Using the comparative polymer (B'), the physical property confirmation experiment was performed as in Example 1. The results are shown in Table 1. In the physical property confirmation experiment, the comparative polymer (B') showed a dissolution rate of not less than $10^{-7}$ m/sec. before the reaction and dissolution rate after the reaction was also not less than $10^{-7}$ m/sec. Therefore, no dissolution rate difference could be obtained before and after the reaction and this polymer was not favorable for photolithographic purpose.

Comparative Example 3

Except that the level of the initiator V-601 was set to 11.5 parts, the procedure of Example 1 was repeated to give a comparative polymer (C'). Using the comparative polymer (C'), the physical property confirmation experiment was performed as in Example 1. The results are shown in Table 1. In the physical property confirmation experiment, the comparative polymer (C') failed to show a sufficiently high dissolution rate, therefore, it is not favorable as a polymer for photolithographic purpose.

EXAMPLES 2 TO 4

By varying the kinds of monomers and the conditions of selective elimination reaction as shown in Table 1, the procedure of Example 1 was otherwise repeated to give copolymers (B) to (D). Using these copolymers (B) to (D), the physical property confirmation experiment was performed as in Example 1. The results are shown in Table 1.

TABLE 1

| | | Example | | | | Compar. Ex. | | |
|---|---|---|---|---|---|---|---|---|
| | | 1 Copolymer (A) | 2 Copolymer (B) | 3 Copolymer (C) | 4 Copolymer (D) | Compar. copolymer (A') | Compar. copolymer (B') | Compar. copolymer (C') |
| Copolymer | | | | | | | | |
| Polymerized | TIBA | 119 | 224 | — | — | 400 | — | 119 |
| monomer | TAMA | — | — | 120 | — | — | — | — |
| composition | TCHA | — | — | — | 250 | — | — | — |
| (parts) | PBS | 642 | 537 | 641 | 511 | 361 | 761 | 642 |
| Initiator V-601 (parts) | | 115 | 64 | 115 | 30 | 115 | 115 | 11.5 |
| Selective elimination reaction (min.) | | 240 | 480 | 240 | 360 | 240 | 240 | 240 |
| Polymer structual | (A) | 10 | 20 | 10 | 25 | 40 | — | 10 |

TABLE 1-continued

| | Example | | | | Compar. Ex. | | |
|---|---|---|---|---|---|---|---|
| Copolymer | 1 Copolymer (A) | 2 Copolymer (B) | 3 Copolymer (C) | 4 Copolymer (D) | Compar. copolymer (A') | Compar. copolymer (B') | Compar. copolymer (C') |
| unit (mole %) (B) | 70 | 80 | 73 | 70 | 48 | 90 | 68 |
| (C) | 20 | — | 17 | 5 | 12 | 10 | 22 |
| Molecular weight Mw | 3970 | 8120 | 4230 | 16500 | 4530 | 3550 | 41500 |
| Mw/Mn | 1.47 | 1.51 | 1.51 | 1.75 | 1.49 | 1.45 | 1.89 |
| Alkaline aqueous dissolution rate ($10^{-10}$ m/sec.) | 90 | 450 | 130 | 60 | 0 (water repelled) | 1000< | 40 |
| Alkaline aqueous dissolution rate after reaction with acid catalyst ($10^{-10}$ m/sec.) | 1000< | 1000< | 1000< | 1000< | 500 | 1000< | 300 |
| Photolithographic physical property | ○ | ○ | ○ | ○ | X | X | Δ |

In Table 1, the abbreviations and symbols have the following meanings.

In the polymerized monomer composition section, TIBA stands for t-butyl (α-isobornyloxymethyl)acrylate; TAMA stands for t-butyl (α-adamantyloxymethyl)acrylate; TCHA stands for t-butyl (α-cyclohexyloxymethyl)acrylate; and PBS stands for p-t-butoxystyrene. In the polymer structural unit section, (A) represents the structural unit constituted by TIBA, TAMA or TCHA; (B) represents the structural unit constituted by p-hydroxystyrene; and (C) represents the structural unit constituted by p-t-butoxystyrene.

What is claimed is:

1. A protolytically leaving group-containing copolymer represented by the following general formula (1):

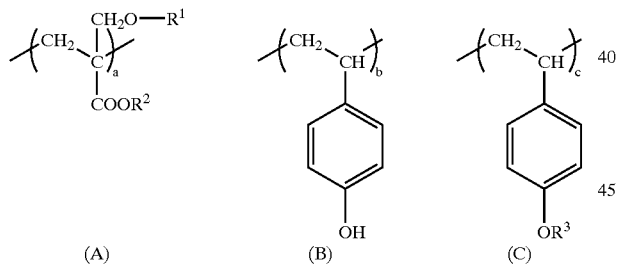

(1)

(A)   (B)   (C)

in the formula, $R^1$, $R^2$ and $R^3$ are the same or different and each represents a protolytically leaving group which may be sustituted or unsubstituted and is selected from the group consisting of t-butyl, isopropyl, cyclic residues of alicyclic compounds of the general formula $C_nH_{2n}$, wherein n is an integer of not less than 3, groups derived from spiro compounds, heteroatom containing functional groups, isobornyl groups, adamantly groups, merhyladamantyl groups, terpene ring containing substituents, derived from norborny ring, bornene ring, menthyl ring, menthane ring, camphor ring, isocamphor ring, sesquiterpene ring, santone ring, diterpene ring, triterpene ring, thujane, sabinene, thujone, carane, careen, pinane, norpinane, bornane, camphene, tricyclene, groups derived from cholesteric ring, bile acid, digitaloids and steroid saponins, and a, b and c represent mole % of repeating units (A), (B) and (C), respectively, in the copolymer, which comprises the repeating unit (A) as well as the repeating unit (B) and/or the repeating unit (C) and has a weight average molecular weight of 2000~30000, said a, b and c satisfying the condition that a is 5 to 30 mole % and (b+c) is 70 to 95 mole %.

2. The protolytically leaving group-containing copolymer according to claim 1, wherein said b is 45 to 95 mole %.

3. The protolytically leaving group-containing copolymer according to claim 1, wherein said $R^1$, $R^2$ and $R^3$ are the same or different and each is a t-butyl, cyclohexyl, isobornyl or adamantyl group.

4. A production method of a protolytically leaving group-containing copolymer comprising a repeating unit (A), (B) and (C) represented by the following formula (1) or a repeating unit (A) and (B) represented by the following general formula (1):

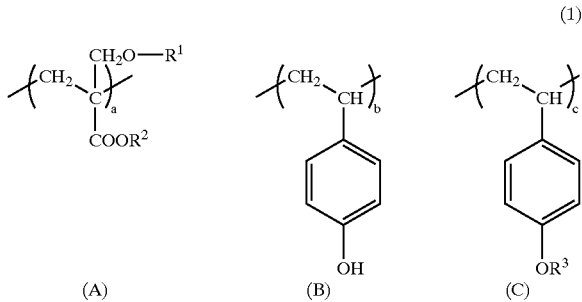

(1)

(A)   (B)   (C)

in the formula, $R^1$, $R^2$ and $R^3$ are the same or different and each represents a protolytically leaving group which may be substituted or unsubstituted and is selected from the group consisting of t-butyl, isopropyl, cyclic residues of alicyclic compounds of the general formula $C_nH_{2n}$, wherein n is an integer of not less than 3, groups derived from spiro compounds, heteroatom containing functional groups, isobornyl groups, adamantly groups, merhyladamantyl groups, terpene ring containing substituents, derived from norbornyl ring, bornene ring, menthyl ring, menthane ring, camphor ring, isocamphor ring, sesquiterpene ring, santone ring, diterpene ring, triterpene ring, thujane, sabinene, thejone, carane, careen, pinane, norpinane, bornane, camphene, tricyclene, groups derived from cholesteric ring, bile acid, digitaloids and steroid saponins, and a, b and c represent the amounts of existence (mole %) of repeating units (A), (B) and (C), respectively, in the copolymer, which comprises carrying out a step of producing a copolymer comprising said repeating unit (A) and said repeating unit (C), followed by carrying out a step of replacing the group represented by $R^3$ in said repeating unit (C) totally or partially with a hydrogen atom to form said repeating unit (B).

5. The production method of the protolytically leaving group-containing copolymer according to claim 1, wherein said acrylic ester derivative is produced by the production method which comprises subjecting an acrylic ester represented by the following general formula (3):

(3)

in the formula, $R^2$ is as defined above, to methylolation to give an α-(hydroxymethyl)acrylic ester and reacting the α-(hydroxymethyl)acrylic ester with an olefin.

* * * * *

UNITED STATES PATENT AND TRADEMARK OFFICE
CERTIFICATE OF CORRECTION

PATENT NO.   : 6,710,150 B2
DATED        : March 23, 2004
INVENTOR(S)  : Nakatani et al.

It is certified that error appears in the above-identified patent and that said Letters Patent is hereby corrected as shown below:

Column 11,
Line 58, change "adamantly" to -- adamantyl --; and change "merhyadamantyl" to -- methyadamantyl --;
Line 63, change "careen" to -- carene --.

Column 12,
Line 60, change "adamantly" to -- adamantyl --; and change "merhyadamantyl" to -- methyadamantyl --;
Line 65, change "careen" to -- carene --.

Signed and Sealed this

Twenty-eighth Day of September, 2004

JON W. DUDAS
*Director of the United States Patent and Trademark Office*